(12) United States Patent
Moss et al.

(10) Patent No.: US 9,148,980 B2
(45) Date of Patent: Sep. 29, 2015

(54) SYSTEM FOR A RACK DESIGN

(75) Inventors: David L. Moss, Austin, TX (US); Shawn P. Hoss, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 1743 days.

(21) Appl. No.: 11/777,586

(22) Filed: Jul. 13, 2007

(65) Prior Publication Data

US 2009/0014397 A1    Jan. 15, 2009

(51) Int. Cl.
H05K 7/18    (2006.01)
H05K 7/20    (2006.01)
G06F 1/20    (2006.01)

(52) U.S. Cl.
CPC .............. *H05K 7/20745* (2013.01); *G06F 1/20* (2013.01); *H05K 7/18* (2013.01)

(58) Field of Classification Search
CPC .. G06F 1/20; H05K 7/20172; H05K 7/20572; H05K 7/20745; H05K 7/18
USPC ........................ 454/184; 361/678, 690, 724
See application file for complete search history.

(56) References Cited

U.S. PATENT DOCUMENTS

| | | | | |
|---|---|---|---|---|
| 4,934,893 | A * | 6/1990 | Johnson | 414/458 |
| 5,289,348 | A * | 2/1994 | Miller | 361/809 |
| 5,835,195 | A * | 11/1998 | Gibson et al. | 355/53 |
| 6,036,286 | A * | 3/2000 | Krumholz | 312/198 |
| 6,259,605 | B1 * | 7/2001 | Schmitt | 361/727 |
| 6,349,039 | B1 * | 2/2002 | Boe | 361/801 |
| 6,452,805 | B1 * | 9/2002 | Franz et al. | 361/724 |
| 6,496,366 | B1 | 12/2002 | Coglitore et al. | |
| 6,604,640 | B1 * | 8/2003 | Jehin | 211/191 |
| 6,644,484 | B1 * | 11/2003 | Sardis | 211/190 |
| 6,667,891 | B2 * | 12/2003 | Coglitore et al. | 361/796 |
| 6,672,955 | B2 * | 1/2004 | Charron | 454/184 |
| 6,702,412 | B2 * | 3/2004 | Dobler et al. | 312/334.5 |
| 6,822,859 | B2 | 11/2004 | Coglitore et al. | |

(Continued)

FOREIGN PATENT DOCUMENTS

JP    2011089686 A * 5/2011

OTHER PUBLICATIONS

Moss, David, Guidelines for Assessing Power and Cooling Requirements in the Data Center, Dell Power Solutions, Aug. 2005, pp. 62-62, located at http://www.dell.com/downloads/global/power/ps3q05-20050115-Moss.pdf.

(Continued)

*Primary Examiner* — Steven B McAllister
*Assistant Examiner* — Frances F Hamilton
(74) *Attorney, Agent, or Firm* — Baker Botts L.L.P.

(57) ABSTRACT

A rack system is disclosed. The racks and the computer systems included within the racks have a shallow configuration. The racks are placed next to one another in a back-to-back configuration in which the backs of each of the racks are adjacent to one another. All of the user-accessible components of the computers system face toward the front of each rack. The heated air from each of the computer systems is expelled in the space between each of the racks. The space between each of the racks is relatively narrow, as there are no user-accessible components between the racks. The racks are coupled to one another with a bar that may include at least some spring action to accommodate some movement of the racks toward or away from one another without the tipping of either rack.

8 Claims, 1 Drawing Sheet

(56) References Cited

U.S. PATENT DOCUMENTS

| | | |
|---|---|---|
| 6,836,030 B2 | 12/2004 | Smith et al. |
| 6,850,408 B1 | 2/2005 | Coglitore et al. |
| 6,859,366 B2 * | 2/2005 | Fink ............................... 361/690 |
| 6,867,966 B2 | 3/2005 | Smith et al. |
| 6,909,611 B2 | 6/2005 | Smith et al. |
| 6,951,288 B2 * | 10/2005 | Henderson ...................... 211/26 |
| 6,995,973 B2 * | 2/2006 | Barsun et al. ............ 361/679.57 |
| 7,085,133 B2 * | 8/2006 | Hall ............................... 361/695 |
| 7,173,821 B2 | 2/2007 | Coglitore |
| 7,192,103 B2 * | 3/2007 | Hamilton ................... 312/334.5 |
| 7,236,358 B2 * | 6/2007 | Dobbs et al. ............ 361/679.31 |
| 7,249,442 B2 * | 7/2007 | Pellegrino et al. ........... 52/167.8 |
| 7,255,234 B2 * | 8/2007 | Luffel et al. .................... 211/26 |
| 7,263,806 B2 * | 9/2007 | Pellegrino et al. ........... 52/167.8 |
| 7,413,091 B2 * | 8/2008 | Krull .............................. 211/162 |
| 7,419,075 B2 * | 9/2008 | Green ............................ 224/405 |
| 7,477,514 B2 * | 1/2009 | Campbell et al. ............. 361/699 |
| 7,682,234 B1 * | 3/2010 | Beitelmal et al. ............. 454/256 |
| 7,748,546 B2 * | 7/2010 | Konstant ........................ 211/191 |
| 7,768,780 B2 * | 8/2010 | Coglitore et al. .............. 361/695 |
| 7,800,900 B1 * | 9/2010 | Noteboom et al. ...... 361/679.47 |
| 7,841,199 B2 * | 11/2010 | VanGilder et al. ........... 62/259.2 |
| 8,015,760 B2 * | 9/2011 | Kemeny ........................ 52/167.4 |
| 8,037,644 B2 * | 10/2011 | Hall ................................ 52/69 |
| 2002/0084236 A1 * | 7/2002 | Gearin et al. ................. 211/85.8 |
| 2004/0104647 A1 * | 6/2004 | Nemec et al. .................. 312/201 |
| 2006/0171667 A1 * | 8/2006 | Murski et al. ................... 386/83 |
| 2008/0170373 A1 * | 7/2008 | Just ............................... 361/729 |
| 2009/0168345 A1 * | 7/2009 | Martini ......................... 361/691 |
| 2010/0061057 A1 * | 3/2010 | Dersch et al. ................. 361/690 |
| 2010/0248609 A1 * | 9/2010 | Tresh et al. .................... 454/184 |

OTHER PUBLICATIONS

Artman, Paul et al., Dell PowerEdge 1650: Rack Impacts on Cooling for High Density Servers, Dell White Paper, Aug. 2002, located at http://www.dell.com/downloads/global/products/pedge/en/rack_coolingdense.doc.

* cited by examiner

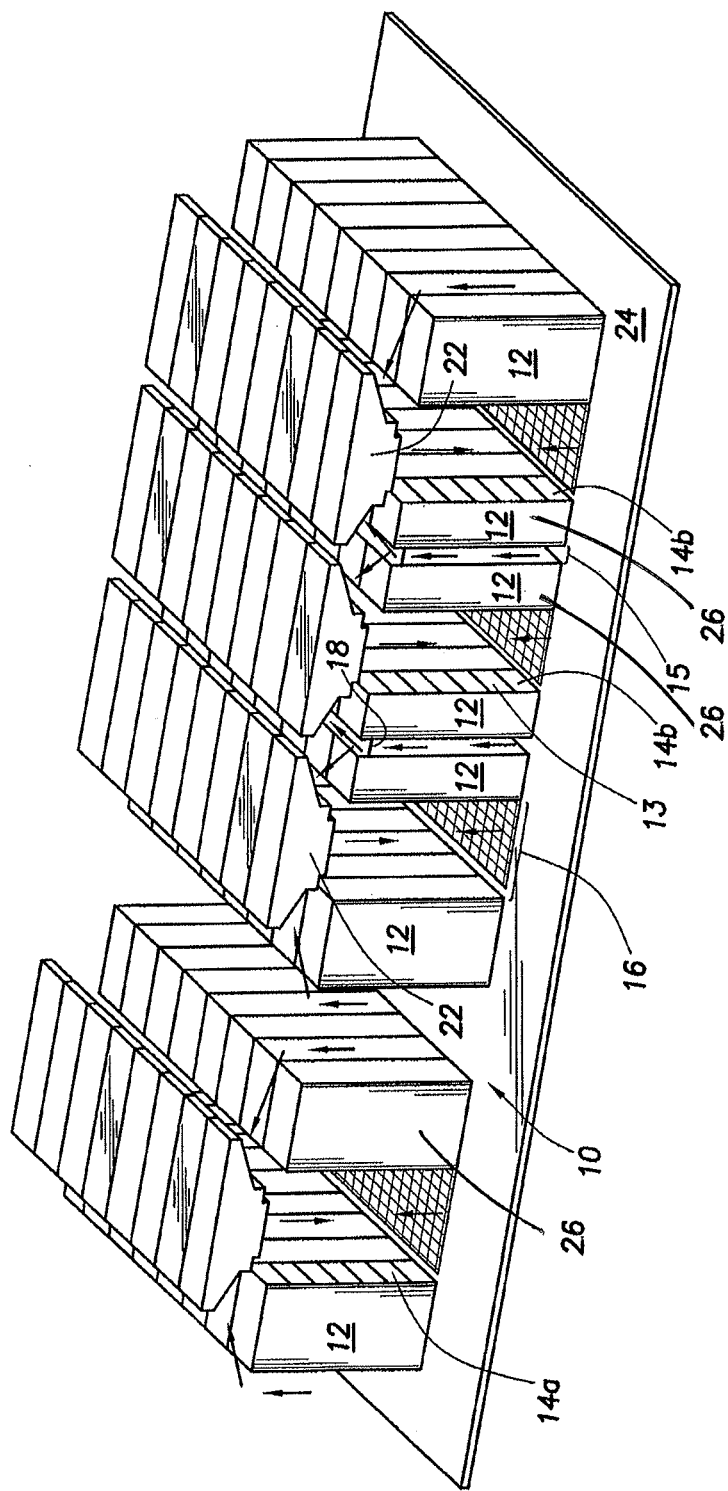

SYSTEM FOR A RACK DESIGN

TECHNICAL FIELD

The present disclosure relates generally to computer systems and information handling systems, and, more particularly, to a system and method for a rack design for an information handling system and the deployment of the rack design in a data center.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system is typically housed with a rack. A rack is a structure that is able to house multiple information handling systems, with each system occupying one or more slots in the rack. Multiple racks can be housed within a single room or data center. The design of the rack typically allows access to and removal of each system from the rack. The depth of a rack is a measure of the distance of the rack in the direction that is transverse to the face of the rack. If a rack is suffciently deep, the rack can house computer systems that have a configuration in which the depth of the chassis or housing of the computer system is long as compared length or width of the face of the computer system.

One difficulty of data centers is the heat generated by the multiple computer systems in the data center. Excessive heat leads to high cooling costs for a data center and can result in the degradation in the performance of the computer systems of the rack or data center. In an effort to remove heat from a data center having multiple racks, racks having a sizeable depth have been arranged in a cooling center along parallel lines in a row so that the heat from two adjacent racks is expelled into a common area between the racks, which area is known as the hot aisle. Directly opposite the hot aisle, on the other side of each row of racks is a cool aisle, which is distinguished by the fact that no heated air is expelled from a rack into the cool aisle. Although the arrangement of rows of racks to create alternating and wide hot aisles and cool aisles creates some advantages in the management of heat generated by the computer systems of the data center, this arrangement has a large footprint and conusmes a susbtantial amount of floor space in the data center, thereby reducing the number of computer systems that can be housed within the avaiable space of the data center.

SUMMARY

In accordance with the present disclosure, a rack system is disclosed. The racks and the computer systems included within the racks have a shallow configuration. The racks are placed next to one another in a back-to-back configuration in which the backs of each of the racks are adjacent to one another. All of the user-accessible components of the computers system face toward the front of each rack. The heated air from each of the computer systems is expelled in the space between each of the racks. The space between each of the racks is relatively narrow, as there are no user-accessible components between the racks. The racks are coupled to one another with a bar that may include at least some spring action to accommodate some movement of the racks toward or away from one another without the tipping of either rack.

The rack system described herein is technically advantageious. Because both the computer systems and the racks have a shallow profile, the footprint of the racks in the data center can be reduced, without sacrificing the computing power or capacity of the data center. In addition, the placement of all of the user-accessible controls of each of the computer systems at the front side of each rack permits the back sides of two adjacent racks to be placed immediately adjacent to one another. Because no access is needed for the back of the racks, two racks may be placed immediately next to each other in a back-to-back configuration in which the space between the racks forms a narrow hot aisle. In addition, because two racks are placed immediately adjacent to one another, the racks can be coupled to one another through a tension rod, which restricts the ability of each of the racks to tip toward or away from one another. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a diagram of the arrangement of rows of racks in a data center.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Shown in FIG. 1 is a diagram of the arrangement of rows of racks in a data center, which is indicated generally at 10. Rows of racks are shown at 12, and individual racks are indicated at 14. In the data center arrangement of FIG. 1, racks 14 are shown in two depth configurations. Deep racks are indicated at 14a, and shallow racks are shown at 14b. Each rack includes a number of computer systems or information handling systems 13, with each rack typically including one computer system in each slot in the rack. Each rack includes a frame and a number of slots formed in frame. In the data center arrangement of FIG. 1, two shallow racks 14b are placed immediately adjacent to one another so that a narrow aisle 15 is formed between adjacent shallow racks 14b. The narrow aisle between immediately adjacent shallow racks is known as a hot aisle because heated air is expelled from the computer systems of each of the adjacent shallow racks into the hot aisle 15.

The hot aisle is narrow in width because of the short distance between each of the adjacent shallow racks that form the boundaries of the hot aisle. The shallow racks 14b are placed in a back-to-back configuration so that the front of each of the racks is oriented to face away from each other so that the back of the racks face toward each other. In this configuration, the front side of the racks is characterized as the side of the racks that includes the set of controls of the computer systems that are most often accessed by the user. These controls of the computer system include the user-adjusted controls of the system, such as the input of media drives and the on-off switch. Hot air is not expelled from the computer systems in the direction of the front side of the racks. In one configuration, all of the user-accessible features of the computer systems of the racks are included on the front side of the rack; and none of the user-accessible features of the computer systems are included on the back side of the rack. The back side of the rack is characterized by the side of the rack from which hot air is expelled from the computer systems of the rack. The aisle that runs along the front side of each of the racks is known as the cool aisle 16 and is characterized by the fact that hot air is not expelled by the computer systems of the racks into the cool aisle.

As shown in FIG. 1, the adjacent shallow racks are coupled to one another through a tension bar 18 that is located near the top portion of each of the shallow racks. Tension bar is a semi-rigid bar that prevents each of the two adjacent rows of racks from tilting toward or away from one another. The tension bar may be biased or otherwise include some spring action in both the compressive and extensive directions to compensate for at least some movement in one of the rows of racks without causing a compensating movement in the other coupled rack. Thus, even though a pair of shallow racks does not include a footprint that is as wide as a standard size rack, the coupling of a tension bar between the racks extends the effective footprint of the racks and prevents the racks from tipping toward or away from one another.

Shallow racks 14b may have a depth of about twenty inches, and the computer systems in the rack may themselves have a shallow configuration with a depth of about fifteen inches or less. The width of the hot aisle, which is the distance between the back of each of the immediately adjacent racks may be as short as eight inches or less. The depth of the rack and the computer systems, and the width of the hot aisle may vary, depending on the precise configuration and design constraints of the data center and racks. Tension bar 18 may be sized so that the distance between the racks is fixed at a preferred distance, which may be eight inches, as just one example. Assuming that the cool aisle between pairs of rows of racks will have a width of thirty-six inches, the footprint of a pair of coupled racks (two racks with a narrow hot aisle between the racks) and an adjacent cool aisle of thirty-six inches will be approximately seventy-two inches in width. This footprint is approximately the same size as the footprint of a standard depth rack with an adjacent a cool aisle.

In the configuration of FIG. 1, all of the user-accessible features of the computers systems of the racks, including the on-off switch and all of the cabling of the computer systems, are oriented to face the cool aisle. None of the user-accessible features of the computer system are oriented toward the hot aisle. In this configuration, because there is no need for a user to access the rear of the racks, the racks may be placed close to one another, and the hot aisle may have a very small width, which results in a reduced footprint for the entire rack configuration.

Data center configuration 10 may also include an end cap 26 that is placed at the end of each pair of immediately adjacent rows of racks. The end cap 26 covers the side opening of the racks at the end of each row of racks. The presence of the end cap 26 prevents heated air from escaping through the sides or ends of the immediately adjacent rows of racks. Because the air cannot escape through the end or sides of the racks, heated air can only escape through the top or upper portion of the racks. A set of supplemental chiller units 22 may be placed above the racks. As indicated by the downward-pointing arrows of FIG. 1, the supplemental chiller units may blow cool air into the cool aisles and may exhaust hot air from the hot aisles. If a vacuum is created at the top of the aisles in the vicinity of the hot aisles, a plenum will be formed in which heated air from the hot aisles moves in an upward direction away from the floor 24 of the data center and toward the chiller units 22 of the data center, as indicated by the upward pointing arrows of FIG. 1.

The configuration for a set of racks provides several advantages. Because both the computer systems and the racks have a shallow profile, the footprint of the racks in the data center can be reduced, without sacrificing the computing power or capacity of the data center. The placement of all of the user-accessible controls of each of the computer systems at the front side of each rack permits the back sides of two adjacent racks to be placed immediately adjacent to one another. Because no access is needed for the back of the racks, two racks may be placed immediately next to each other in a back-to-back configuration in which the space between the racks forms a narrow hot aisle. Because two racks are placed immediately adjacent to one another, the racks can be coupled to one another through a tension rod, which restricts the ability of each of the racks to tip toward or away from one another. Although the present disclosure has been described in detail, it should be understood that various changes, substitutions, and alterations can be made hereto without departing from the spirit and the scope of the invention as defined by the appended claims.

What is claimed is:

1. A rack system for housing multiple computer systems, comprising
 a plurality of adjacent rows of racks;
 a plurality of end caps, wherein the end caps cover the side opening of each rack at the end of the rows of racks, wherein the end caps prevent heated air from escaping;

a first rack in a first portion of a first row of the rows of racks, wherein the first rack is sized to house multiple computer systems, and wherein the depth of the first rack is at most twenty inches;

second rack in a second portion of a first row of the rows of racks coupled to the first rack, wherein the second rack is sized to house multiple computer systems, wherein the depth of the second rack is at most twenty inches, and wherein the first rack is coupled to a second rack through a bar member coupled between the first rack and a second rack, wherein the bar member includes spring action in both compressive and extensive directions, and wherein the bar member compensates for a movement of the second rack, by compressing or extending, without causing a corresponding movement in the first rack when the first rack and second rack are each loaded with multiple computer systems;

a hot aisle, wherein the hot aisle is between the first portion and the second portion of the first row by the back-to-back configuration of the first rack and the second rack;

a third rack in a second row of the rows of racks adjacent to the coupled first rack and second rack, wherein the third rack is sized to house multiple computer systems, wherein the depth of the third rack is at least thirty-six inches; and a cool aisle, wherein the cool aisle separates each of the adjacent rows of racks, and wherein the front side of the first rack and the front side of the third rack faces the cool aisle;

wherein the first rack and the second rack are coupled to one another in a back-to-back configuration, and wherein all of the user-accessible controls of each of the computer systems are accessible through the front side of each of the respective racks, wherein the depth of the third rack is greater than the depth of the back-to-back configuration of the first rack and the second; and wherein the third rack is independent of the first and second racks.

2. The rack system of claim 1, wherein the distance between the first rack and the second rack is at least eight inches.

3. The rack system of claim 1, wherein the distance between the first rack and the second rack is at most eight inches.

4. The rack system of claim 1, wherein heated air generated by the computer systems is expelled in the space between the first rack and the second rack.

5. The rack system of claim 1, wherein heated air generated by the computer systems is not expelled toward the front side of the respective racks.

6. The rack system of claim 1, wherein the bar member prevents the first rack and the second rack from tipping towards each other.

7. The rack system of claim 1, wherein the bar member limits a movement of the first rack and the second rack toward one another.

8. The rack system of claim 1, wherein the bar member limits a movement of the first rack and the second rack away from one another.

\* \* \* \* \*